US006891494B2

(12) United States Patent
Choi

(10) Patent No.: US 6,891,494 B2
(45) Date of Patent: May 10, 2005

(54) LAYOUT METHOD OF A COMPARATOR ARRAY FOR FLASH TYPE ANALOG TO DIGITAL CONVERTING CIRCUIT

(75) Inventor: Hee-Cheol Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/687,084

(22) Filed: Oct. 16, 2003

(65) Prior Publication Data

US 2004/0080445 A1 Apr. 29, 2004

(30) Foreign Application Priority Data

Oct. 24, 2002 (KR) ................................ 10-2002-0065286

(51) Int. Cl.$^7$ .............................................. H03M 1/36
(52) U.S. Cl. ....................................... 341/159; 341/158
(58) Field of Search ................................. 341/158, 159

(56) References Cited

U.S. PATENT DOCUMENTS

| | | | | |
|---|---|---|---|---|
| 5,416,484 A | * | 5/1995 | Lofstrom | 341/159 |
| 5,554,989 A | * | 9/1996 | Kumamoto et al. | 341/159 |
| 6,014,097 A | * | 1/2000 | Brandt | 341/158 |

* cited by examiner

Primary Examiner—Howard L. Williams
(74) Attorney, Agent, or Firm—Mills & Onello LLP

(57) ABSTRACT

The present invention discloses a layout method of a comparator array of a flash type analog to digital converting circuit. The flash type analog to digital converting circuit includes a reference voltage for generating $2^{n-1}$ voltages and being arranged to be folded; a comparator array including $(2^n-1)$ comparators for comparing voltage differences between the respective $2^{n-1}$ voltages and an analog input signal to generate a digital thermometer code having $(2^n-1)$ bits and an encoder for encoding the digital thermometer code having $(2^n-1)$ bits to generate an n-bit digital signal. The layout method of the flash type analog to digital converting circuit comprises arranging the comparators such that the comparators of $(2^n-1)^{th}$ comparator to $(2^n/2)^{th}$ comparator are arranged in order and the comparators of $(2^n/2-1)^{th}$ comparator to a first comparator are arranged in reverse fashion between the comparators of the $(2^n-1)^{th}$ comparator to the $(2^n/2)^{th}$ comparator; and arranging the comparators such that the neighboring comparators adjacent to the respective $(2^n-1)$ comparators remain at to the same state when the $(2^n-1)^{th}$ comparator to the $(2^n/2)^{th}$ comparator transit to different states respectively. Therefore, increasing of an offset voltage due to the effects of the neighboring comparators is prevented without increasing a layout area size.

10 Claims, 4 Drawing Sheets

LAYOUT METHOD OF A COMPARATOR ARRAY FOR FLASH TYPE ANALOG TO DIGITAL CONVERTING CIRCUIT

BACKGROUND OF INVENTION

1. Field of the Invention

The present invention relates to a flash type analog to digital (A/D) converting circuit, and more particularly, to a layout method of a comparator array for a flash type A/D converting circuit.

2. Description of Related Art

A conventional flash type analog to digital (A/D) converting circuit includes a reference voltage generating circuit, a thermometer code generating circuit, and an encoder. The reference voltage generating circuit includes a quantity $2^n$ of resistors, and the thermometer code generating circuit includes a comparator array having $(2^n-1)$ comparators.

In a layout method of the $2^n$ resistors and the $(2^n-1)$ comparators of the conventional flash type A/D converting circuit, the $2^n$ resistors are folded in two rows in order to gather a reference voltage input terminal and an analog signal input terminal. So, the $(2^n-1)$ comparators are not arranged in order but in turn.

When the $(2^n-1)$ comparators undergo a state transition, respective neighboring comparators also undergo a state transition. Here, by the layout method described above, a digital signal output from the neighboring comparators do not remain at to the same state but transit to a different state. As a result, since the neighboring comparators adjacent to the comparators affect operation of the comparators to thereby increase an offset voltage of the comparators, an accurate digital signal cannot be generated.

Even though a dummy element or metal can be added to remove such a problem, there is a problem in that this increases a layout area size.

SUMMARY OF THE INVENTION

It is an object of the present invention to provide a layout method of a comparator array for a flash type analog to digital converting circuit which can prevent an offset voltage of comparators from being increased due to the effects of neighboring comparators.

In order to achieve the above object, the preferred embodiments of the present invention provide a layout method of a comparator array of a flash type analog to digital converting circuit, the flash type analog to digital converting circuit including: (i) a reference voltage for generating $(2^n-1)$ voltages and being arranged to be folded; (ii) a comparator array including $(2^n-1)$ comparators for comparing voltage differences between the respective $(2^n-1)$ voltages and an analog input signal to generate a digital thermometer code having $(2^n-1)$ bits; and (iii) an encoder for encoding the digital thermometer code having $(2^n-1)$ bits to generate an n-bit digital signal. According to the layout method, the comparators are arranged such that the comparators of $(2^n-1)^{th}$ comparator to $(2^n/2)^{th}$ comparator are arranged in order and the comparators of $(2^n/2-1)^{th}$ comparator to a first comparator are arranged in a reverse fashion between the comparators of the $(2^n-1)^{th}$ comparator to the $(2^n/2)^{th}$ comparator. The comparators are arranged such that the neighboring comparators adjacent to the respective $(2^n-1)$ comparators remain at the same state when the $(2^n-1)^{th}$ comparator to the $(2^n/2)^{th}$ comparator transit to different states respectively.

Each of the $(2^n-1)$ comparators can include a positive input and output terminal and a negative input and output terminal, and the terminals of and the comparators from the $(2^n-1)^{th}$ comparator to the $(2^n/2)^{th}$ comparator are arranged in order of the positive input and output terminal, the negative input and output terminal, the negative input and output terminal, the positive input and output terminal, the negative input and output terminal, the positive input and output terminal, the positive input and output terminal, and the negative input and output terminal.

Alternatively, each of the $(2^n-1)$ number of comparators can include a positive input and output terminal and a negative input and output terminal, and the terminals of the comparators from the $(2^n-1)^{th}$ comparator to the $(2^n/2)^{th}$ comparator can be arranged in order of the negative input and output terminal, the positive input and output terminal, the negative input and output terminal, the positive input and output terminal, the negative input and output terminal, the negative input and output terminal, and the positive input and output terminal.

The comparator array can include first and second dummy comparators, the first dummy comparator arranged adjacent to the $(2^n-1)^{th}$ comparator, the second dummy comparator arranged adjacent to $(2^n/2)^{th}$ comparator, wherein the comparators from the first dummy comparator to the second dummy comparators include positive and negative input and output terminals, respectively, and the the terminals of comparators from the first dummy comparator to the second dummy comparators are arranged in order of the positive input and output terminal, the negative input and output terminal, the negative input and output terminal, the positive input and output terminal, the negative input and output terminal, the positive input and output terminal, the positive input and output terminal, and the negative input and output terminal.

The second dummy comparator can be configured such that a reference voltage and an analog input signal applied to the positive input terminal of the $(2^n/2-1)^{th}$ comparator are applied to the positive input terminal of the second dummy comparator, and a reference voltage and an analog input signal applied to the negative input terminal of the $(2^n/2-1)^{th}$ comparator are applied to the negative input terminal of the second dummy comparator.

The comparator array can include first and second dummy comparators, the first dummy comparator arranged adjacent to the $(2^n-1)^{th}$ comparator, the second dummy comparator arranged adjacent to $(2^n/2)^{th}$ comparator, wherein the comparators from the first dummy comparator to the second dummy comparators include positive and negative input and output terminals, respectively, and the terminals of the comparators from the first dummy comparator to the second dummy comparators are arranged in order of the negative input and output terminal, the positive input and output terminal, the negative input and output terminal, the positive input and output terminal, the positive input and output terminal, the negative input and output terminal, the positive input and output terminal, and the negative input and output terminal.

The second dummy comparator can be configured such that a reference voltage and an analog input signal applied to the positive input terminal of the $(2^n/2-1)^{th}$ comparator are applied to the positive input terminal of the second dummy comparator, and a reference voltage and an analog input signal applied to the negative input terminal of the $(2^n/2-1)^{th}$ comparator are applied to the negative input terminal of the second dummy comparator.

According to another aspect, the invention is directed to a layout method of a comparator array, comprising, among ($2^n-1$) comparators for comparing voltage differences between each of ($2^n-1$) voltages and an analog input signal to generate a digital signal having ($2^n-1$) thermometer codes, (i) arranging the comparators such that the comparators of $(2^n-1)_{th}$ comparator to $(2^n/2)^{th}$ comparator are arranged in order and the comparators of $(2^n/2-1)^{th}$ comparator to a first comparator are arranged in a reverse fashion between the comparators of the $(2^n-1)^{th}$ comparator to the $(2^n/2)^{th}$ comparator; and (ii) arranging the comparators such that the neighboring comparators adjacent to the respective ($2^n-1$) comparators remain at the same state when the $(2^n-1)^{th}$ comparator to the $(2^n/2)^{th}$ comparator transit to different states respectively.

Each of the ($2^n-1$) comparators includes a positive input and output terminal and a negative input and output terminal, and the terminals of the comparators from the $(2^n-1)^{th}$ comparator to the $(2^n/2)^{th}$ comparator are arranged in order of the positive input and output terminal, the negative input and output terminal, the positive input and output terminal, the negative input and output terminal, the positive input and output terminal, the positive input and output terminal, and the negative input and output terminal.

Each of the ($2^n-1$) comparators can include a positive input and output terminal and a negative input and output terminal, and the terminals of the comparators from the $(2^n-1)^{th}$ comparator to the $(2^n/2)^{th}$ comparator are arranged in order of the negative input and output terminal, the positive input and output terminal, the negative input and output terminal, the positive input and output terminal, the positive input and output terminal, the negative input and output terminal, the negative input and output terminal, and the positive input and output terminal.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFFERED EMBODIMENTS

Figure 1:
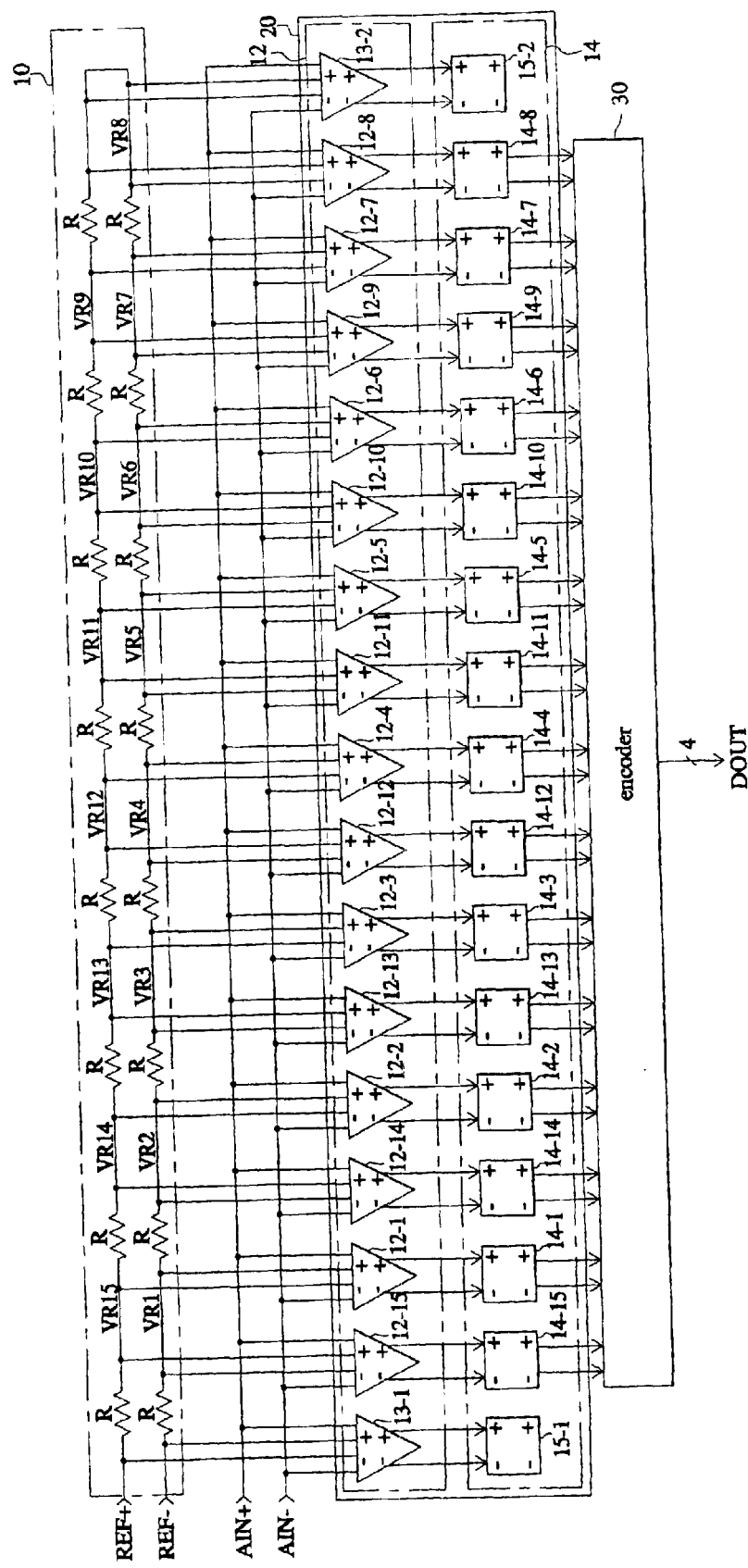
FIG. 1 is a circuit diagram illustrating a layout of a conventional flash type analog to digital (A/D) converting circuit.

FIG. 1 is a circuit diagram illustrating a layout of a conventional flash type analog to digital (A/D) converting circuit. The conventional flash type A/D converting circuit of FIG. 1 includes a reference voltage generating circuit 10, a comparator array 20, and an encoder 30.

As shown in FIG. 1, the reference voltage generating circuit 10 includes 16 resistors which are serially connected between a reference voltage REF+ and a reference voltage REF−. The comparator array 20 includes a pre-amplifying circuit 12 and a latch circuit 14. The pre-amplifying circuit 12 includes 15 pre-amplifiers 12-1 to 12-15 and 2 dummy pre-amplifiers 13-1 and 13-2. The latch circuit 14 includes 15 latches 14-1 to 14-5 and 2 dummy latches 15-1 and 15-2.

In FIG. 1, a single pre-amplifier and a single of latch constitute a single comparator. A layout of the flash type A/D converting circuit of FIG. 1 is described below.

The reference voltage (REF+, REF−) terminals and analog signal input terminals AIN+ and AIN− are arranged on one side. Sixteen (16) resistors R are arranged, folded, and fifteen (15) pre-amplifiers 12-1 to 12-15 are not arranged in order but in the order of 12-15, 12-1, 12-14, 12-2, . . . , 12-7, and 12-8. The dummy pre-amplifiers 13-1 and 13-2 are arranged on both sides of 15 pre-amplifiers 12-1 to 12-15, respectively. Fifteen (15) latches 14-1 to 14-15 are arranged in the order of 14-15, 14-1, 14-14, 14-2, . . . , 14-7, 14-8. Dummy latches 15-1 and 15-2 are arranged on both sides of 15 latches 14-1 to 14-15.

Operation of the flash type A/D converting circuit of FIG. 1 is described below.

The 16 resistors R divide the voltage REF+ and the voltage REF− to generate 15 levels of divided reference voltages VR1 to VR15. That is, if the voltage REF− is 0 volts and the voltage REF− is 1 volt, the reference voltages of 1/16 volts to 15/16 volts are generated.

The pre-amplifier 12-1 amplifies a voltage difference between the reference voltage VR1 and the analog input signal AIN+ and then outputs an amplified signal to its positive output terminal, and amplifies a voltage difference between the reference voltage VR15 and the analog input signal AIN− and outputs an amplified signal to its negative output terminal. The pre-amplifier 12-15 amplifies a voltage difference between the reference voltage VR15 and the analog input signal AIN+ and then outputs an amplified signal to its positive output terminal, and amplifies a voltage difference between the reference voltage VR1 and the analog input signal AIN− and outputs an amplified signal to its negative output terminal. Similarly, the pre-amplifiers 12-2 to 12-14 respectively amplify voltage differences between the reference voltage VR2 to VR14 and the analog input signal AIN+ and then output amplified signals to the positive output terminal, and respectively amplify voltage differences between the reference voltage VR14 to VR2 and the analog input signal AIN− and output amplified signals to the negative output terminal.

The latch 14-1 latches signals outputted from the negative and positive terminals of the pre-amplifier 12-1, respectively, and outputs latched signals to its negative and positive terminals. Here, output signals are digital signals having 0 and 1 logic levels.

The encoder 30 encodes a digital thermometer code having ($2^n-1$) bits outputted from the comparator array 20 to generate an n-bit digital signal.

Table 1 shows states of digital signals output from the negative and positive output terminals of the comparators in the comparator array according to a level of an analog input signal AIN in the flash type A/D converting circuit of FIG. 1.

TABLE 1

| AIN | DC1 - + | C15 - + | C1 - + | C14 - + | C2 - + | C13 - + | C3 - + | C12 - + | C4 - + | C11 - + | C5 - + | C10 - + | C6 - + | C9 - + | C7 - + | C8 - + | DC2 - + |
|---|---|---|---|---|---|---|---|---|---|---|---|---|---|---|---|---|---|
| 16 | 0 1 | 0 1 | 0 1 | 0 1 | 0 1 | 0 1 | 0 1 | 0 1 | 0 1 | 0 1 | 0 1 | 0 1 | 0 1 | 0 1 | 0 1 | 0 1 | 0 1 |
| 15 | 0 1 | 1 0 | 0 1 | 0 1 | 0 1 | 0 1 | 0 1 | 0 1 | 0 1 | 0 1 | 0 1 | 0 1 | 0 1 | 0 1 | 0 1 | 0 1 | 0 1 |
| 14 | 0 1 | 1 0 | 0 1 | 1 0 | 0 1 | 0 1 | 0 1 | 0 1 | 0 1 | 0 1 | 0 1 | 0 1 | 0 1 | 0 1 | 0 1 | 0 1 | 0 1 |
| 13 | 0 1 | 1 0 | 0 1 | 1 0 | 0 1 | 1 0 | 0 1 | 0 1 | 0 1 | 0 1 | 0 1 | 0 1 | 0 1 | 0 1 | 0 1 | 0 1 | 0 1 |
| 12 | 0 1 | 1 0 | 0 1 | 1 0 | 0 1 | 1 0 | 0 1 | 1 0 | 0 1 | 0 1 | 0 1 | 0 1 | 0 1 | 0 1 | 0 1 | 0 1 | 0 1 |
| 11 | 0 1 | 1 0 | 0 1 | 1 0 | 0 1 | 1 0 | 0 1 | 1 0 | 0 1 | 1 0 | 0 1 | 0 1 | 0 1 | 0 1 | 0 1 | 0 1 | 0 1 |
| 10 | 0 1 | 1 0 | 0 1 | 1 0 | 0 1 | 1 0 | 0 1 | 1 0 | 0 1 | 1 0 | 0 1 | 1 0 | 0 1 | 0 1 | 0 1 | 0 1 | 0 1 |
| 9 | 0 1 | 1 0 | 0 1 | 1 0 | 0 1 | 1 0 | 0 1 | 1 0 | 0 1 | 1 0 | 0 1 | 1 0 | 0 1 | 1 0 | 0 1 | 0 1 | 0 1 |
| 8 | 0 1 | 1 0 | 0 1 | 1 0 | 0 1 | 1 0 | 0 1 | 1 0 | 0 1 | 1 0 | 0 1 | 1 0 | 0 1 | 1 0 | 0 1 | 1 0 | 1 0 |
| 7 | 0 1 | 1 0 | 0 1 | 1 0 | 0 1 | 1 0 | 0 1 | 1 0 | 0 1 | 1 0 | 0 1 | 1 0 | 0 1 | 1 0 | 1 0 | 1 0 | 1 0 |
| 6 | 0 1 | 1 0 | 0 1 | 1 0 | 0 1 | 1 0 | 0 1 | 1 0 | 0 1 | 1 0 | 0 1 | 1 0 | 1 0 | 1 0 | 1 0 | 1 0 | 1 0 |
| 5 | 0 1 | 1 0 | 0 1 | 1 0 | 0 1 | 1 0 | 0 1 | 1 0 | 0 1 | 1 0 | 1 0 | 1 0 | 1 0 | 1 0 | 1 0 | 1 0 | 1 0 |
| 4 | 0 1 | 1 0 | 0 1 | 1 0 | 0 1 | 1 0 | 0 1 | 1 0 | 1 0 | 1 0 | 1 0 | 1 0 | 1 0 | 1 0 | 1 0 | 1 0 | 1 0 |
| 3 | 0 1 | 1 0 | 0 1 | 1 0 | 0 1 | 1 0 | 1 0 | 1 0 | 1 0 | 1 0 | 1 0 | 1 0 | 1 0 | 1 0 | 1 0 | 1 0 | 1 0 |
| 2 | 0 1 | 1 0 | 0 1 | 1 0 | 1 0 | 1 0 | 1 0 | 1 0 | 1 0 | 1 0 | 1 0 | 1 0 | 1 0 | 1 0 | 1 0 | 1 0 | 1 0 |
| 1 | 0 1 | 1 0 | 1 0 | 1 0 | 1 0 | 1 0 | 1 0 | 1 0 | 1 0 | 1 0 | 1 0 | 1 0 | 1 0 | 1 0 | 1 0 | 1 0 | 1 0 |

In table 1, DC1 and DC2 denote the dummy comparators which respectively include the dummy pre-amplifiers 13-1 and 13-2 and the dummy latches 15-1 and 15-2. C1 to C15 denote comparators which include the pre-amplifiers 12-1 to 12-15 and the latches 14-1 to 14-15. AIN denotes a voltage that a voltage of the analog input signal AIN+ subtracts a voltage of the analog input signal AIN−. 1 to 16 denote voltage levels of the analog input signals. Here, 1 denotes a voltage level of REF− to VR1, 2 denotes a voltage level of VR1 to VR2, and 16 denotes a voltage level of VR15 and REF+.

The comparator C15 generates a digital signal of 0 and 1 through the negative and positive output terminals, respectively, when the analog input signal AIN of level of VR15 to REF is applied and generates a digital signal of 1 and 0 when the analog input signal AIN of level lower than a level of the reference voltage V15.

The comparator C1 generates a digital signal of 1 and 0 through the negative and positive output terminals, respectively, when the analog input signal AIN of level of REF− to VR1 is applied and generates a digital signal of 0 and 1 when the analog input signal AIN of level higher than a level of the reference voltage V1.

However, when a level transition occurs in the negative and positive output terminals of the comparators C1 to C15, the neighboring comparators transit to different states, respectively.

For example, in the comparator C1, when the analog input signal transits from a level of REF− to VR1 to a level of VR1 to VR2, the digital signal of the negative output terminal transits from 1 to 0, and the digital signal of the positive output terminal transits from 0 to 1. At this time, the digital signal of the positive output terminal of the neighboring comparator C15 transits from 0 to 1, and the digital signal of the negative output terminal of the neighboring comparator C14 transits from 1 to 0. That is, the digital signals outputted from the neighboring comparators C15 and C14 transit to different states.

Hence, the comparator C1 is affected by the neighboring comparators C15 and C14, and so an offset voltage exceeds an allowable range. Therefore, there is a problem in that an accurate digital signal cannot be generated.

For example, the comparator C1 should generate a digital signal of 1 and 0 when the analog input signal AIN has a level of REF− to VR1. But, in the case that an offset voltage exceeds an allowable range, the digital signal of 1 and 0 is generated even when the analog input signal AIN has a level higher than a level of REF− to VR1, and the digital signal of 0 and 1 is generated even when the analog input signal AIN has a level lower than a level of VR1 to VR2. That is, when the analog input signal AIN has a level of VR1 to VR2, the digital signal of 0 and 1 should be generated, but the digital signal of 1 and 0 is generated. When the analog input signal AIN has a level of REF− to VR1, the digital signal of 1 and 0 should be generated, but the digital signal of 0 and 1 is generated.

An experiment verified that when an allowable offset voltage of each of the comparators C1 to C15 is 8 mV, at the time that states of digital signals outputted from the comparators C1 to C15 are changed, an offset voltage of each of the comparators C1 to C15 is increased to 10 mV∼30 mV by the neighboring comparators transiting to different states.

Figure 2:
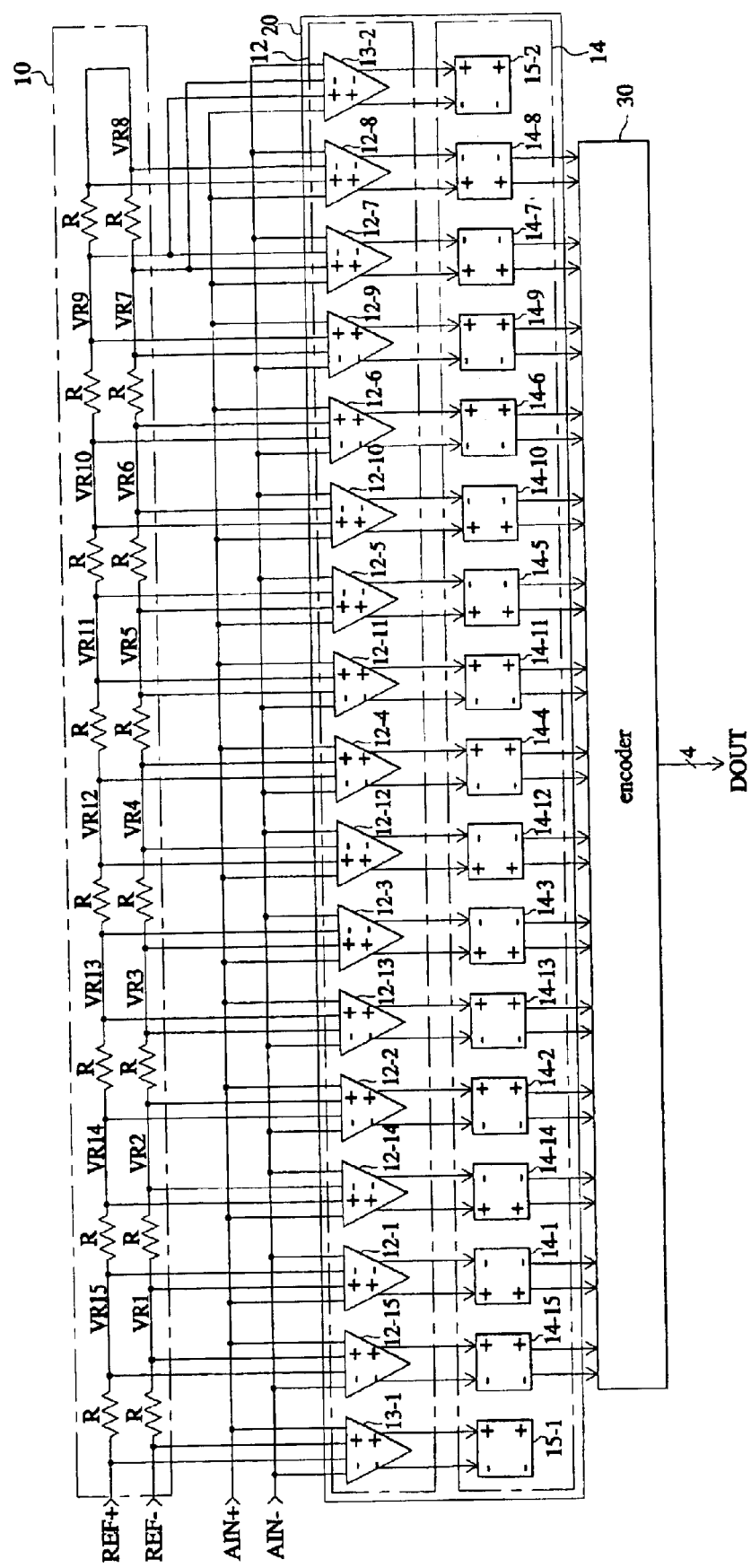
FIG. 2 is a circuit diagram illustrating a layout of a flash type A/D converting circuit according to the present invention.

FIG. 2 is a circuit diagram illustrating a layout of a flash type A/D converting circuit according to the present invention. The flash type A/D converting circuit of FIG. 2 is similar in configuration to that of FIG. 1 except that the negative and positive input and output terminals of the pre-amplifiers 12-1, 12-14, 12-3, 12-12, 12-5, 12-10, 12-7, and 12-8 and the latches 14-1, 14-14, 14-3, 14-12, 14-5, 14-10, 14-7, and 14-8 are different in position and that the reference voltages VR9 and VR7 are configured to be applied to the dummy pre-amplifier 13-2.

In FIG. 2, a circuit of the dummy pre-amplifiers 13-1 and 13-2 and the preamplifiers 12-15, 12-2, 12-13, 12-4, 12-11, 12-6, and 12-9 and a circuit of the preamplifiers 12-1, 12-14, 12-3, 12-12, 12-5, 12-10, 12-7, and 12-8 are symmetrically configured. Similarly, a circuit of the dummy latches 15-1 and 15-2 and the latches 14-15, 14-2, 14-13, 14-4, 14-11, 14-6, and 14-9 and a circuit of the latches 14-1, 14-14, 14-3, 14-12, 14-5, 14-10, 14-7, and 14-8 are symmetrically configured.

Operation of the flash type A/D converting circuit of FIG. 2 is the same as that of FIG. 1 and can be readily understood with reference to a description of FIG. 1.

Table 2 shows states of digital signals outputted from the negative and positive output terminals of the comparators in the comparator array according to a level of an analog input signal AIN in the flash type A/D converting circuit of FIG. 2.

TABLE 2

| AIN | DC1 − + | C15 − + | C1 − + | C14 − + | C2 − + | C13 − + | C3 − + | C12 − + | C4 − + | C11 − + | C5 − + | C10 − + | C6 − + | C9 − + | C7 − + | C8 − + | DC2 − + |
|---|---|---|---|---|---|---|---|---|---|---|---|---|---|---|---|---|---|
| 16 | 0 1 | 0 1 | 1 0 | 1 0 | 0 1 | 0 1 | 1 0 | 1 0 | 0 1 | 0 1 | 1 0 | 1 0 | 0 1 | 0 1 | 1 0 | 1 0 | 0 1 |
| 15 | 0 1 | 1 0 | 1 0 | 1 0 | 0 1 | 0 1 | 1 0 | 1 0 | 0 1 | 0 1 | 1 0 | 1 0 | 0 1 | 0 1 | 1 0 | 1 0 | 0 1 |
| 14 | 0 1 | 1 0 | 1 0 | 0 1 | 0 1 | 0 1 | 1 0 | 1 0 | 0 1 | 0 1 | 1 0 | 1 0 | 0 1 | 0 1 | 1 0 | 1 0 | 0 1 |
| 13 | 0 1 | 1 0 | 1 0 | 0 1 | 0 1 | 1 0 | 1 0 | 1 0 | 0 1 | 0 1 | 1 0 | 1 0 | 0 1 | 0 1 | 1 0 | 1 0 | 0 1 |
| 12 | 0 1 | 1 0 | 1 0 | 0 1 | 0 1 | 1 0 | 1 0 | 0 1 | 0 1 | 0 1 | 1 0 | 1 0 | 0 1 | 0 1 | 1 0 | 1 0 | 0 1 |
| 11 | 0 1 | 1 0 | 1 0 | 0 1 | 0 1 | 1 0 | 1 0 | 0 1 | 0 1 | 1 0 | 1 0 | 1 0 | 0 1 | 0 1 | 1 0 | 1 0 | 0 1 |
| 10 | 0 1 | 1 0 | 1 0 | 0 1 | 0 1 | 1 0 | 1 0 | 0 1 | 0 1 | 1 0 | 1 0 | 0 1 | 0 1 | 0 1 | 1 0 | 1 0 | 0 1 |
| 9 | 0 1 | 1 0 | 1 0 | 0 1 | 0 1 | 1 0 | 1 0 | 0 1 | 0 1 | 1 0 | 1 0 | 0 1 | 0 1 | 1 0 | 1 0 | 1 0 | 0 1 |
| 8 | 0 1 | 1 0 | 1 0 | 0 1 | 0 1 | 1 0 | 1 0 | 0 1 | 0 1 | 1 0 | 1 0 | 0 1 | 0 1 | 1 0 | 1 0 | 0 1 | 0 1 |
| 7 | 0 1 | 1 0 | 1 0 | 0 1 | 0 1 | 1 0 | 1 0 | 0 1 | 0 1 | 1 0 | 1 0 | 0 1 | 0 1 | 1 0 | 0 1 | 0 1 | 1 0 |
| 6 | 0 1 | 1 0 | 1 0 | 0 1 | 0 1 | 1 0 | 1 0 | 0 1 | 0 1 | 1 0 | 1 0 | 0 1 | 1 0 | 1 0 | 0 1 | 0 1 | 1 0 |
| 5 | 0 1 | 1 0 | 1 0 | 0 1 | 0 1 | 1 0 | 1 0 | 0 1 | 0 1 | 1 0 | 0 1 | 0 1 | 1 0 | 1 0 | 0 1 | 0 1 | 1 0 |
| 4 | 0 1 | 1 0 | 1 0 | 0 1 | 0 1 | 1 0 | 1 0 | 0 1 | 1 0 | 1 0 | 0 1 | 0 1 | 1 0 | 1 0 | 0 1 | 0 1 | 1 0 |
| 3 | 0 1 | 1 0 | 1 0 | 0 1 | 0 1 | 1 0 | 0 1 | 0 1 | 1 0 | 1 0 | 0 1 | 0 1 | 1 0 | 1 0 | 0 1 | 0 1 | 1 0 |
| 2 | 0 1 | 1 0 | 1 0 | 0 1 | 1 0 | 1 0 | 0 1 | 0 1 | 1 0 | 1 0 | 0 1 | 0 1 | 1 0 | 1 0 | 0 1 | 0 1 | 1 0 |
| 1 | 0 1 | 1 0 | 0 1 | 0 1 | 1 0 | 1 0 | 0 1 | 0 1 | 1 0 | 1 0 | 0 1 | 0 1 | 1 0 | 1 0 | 0 1 | 0 1 | 1 0 |

Symbols of FIG. 2 are indicated by the same convention as those of FIG. 1.

A digital signal outputted from the comparators C1 to C15 of table 2 is the same as that outputted from the comparators C1 to C15 of table 1.

But, since positions of the negative and positive input and output terminals of the comparators C1, C14, C3, C12, C5, C10, C7, and C8 are changed, positions of the digital signals outputted are also changed. That is, a digital signal outputted from the comparators C1, C14, C3, C12, C5, C10, C7, and C8 is 1 and 0 in table 1 but 0 and 1 in table 2, and 0 and 1 in table 1 but 1 and 0 in table 2.

As can be seen in table 2, when the digital signal outputted from the negative and positive output terminals of each of the comparators C1 to C15 transits from 0, 1 to 1, 0 and from 1, 0 to 0, 1, the digital signal outputted from the positive or negative output terminals of the neighboring comparators remains at or 1. That is, the digital signal outputted from the positive or negative output terminals of the neighboring comparators adjacent to each of the comparators C1 to C15 remains at the same state.

For example, in comparator C1, when the analog input signal transits from a level of REF− to VR1 to a level of VR1 to VR2, the digital signal of the negative output terminal transits from 1 to 0, and the digital signal of the positive output terminal transits from 0 to 1. At this time, the digital signal of the positive output terminal of the neighboring comparator C15 remains at 0 , and the digital signal of the positive output terminal of the neighboring comparator C14 remains at 0 . That is, the digital signals of the positive output terminals of the neighboring comparators C15 and C14 remains at the same state. Hence, an accurate digital signal can be generated because a phenomenon is prevented that the comparator C1 affects operation of the neighboring comparators C15 and C14 to thereby increase an offset voltage.

Similarly, accurate digital signals can be generated because a phenomenon is prevented that the comparators C2 to C15 affect operation of the neighboring comparators to thereby increase an offset voltage.

Figure 3:
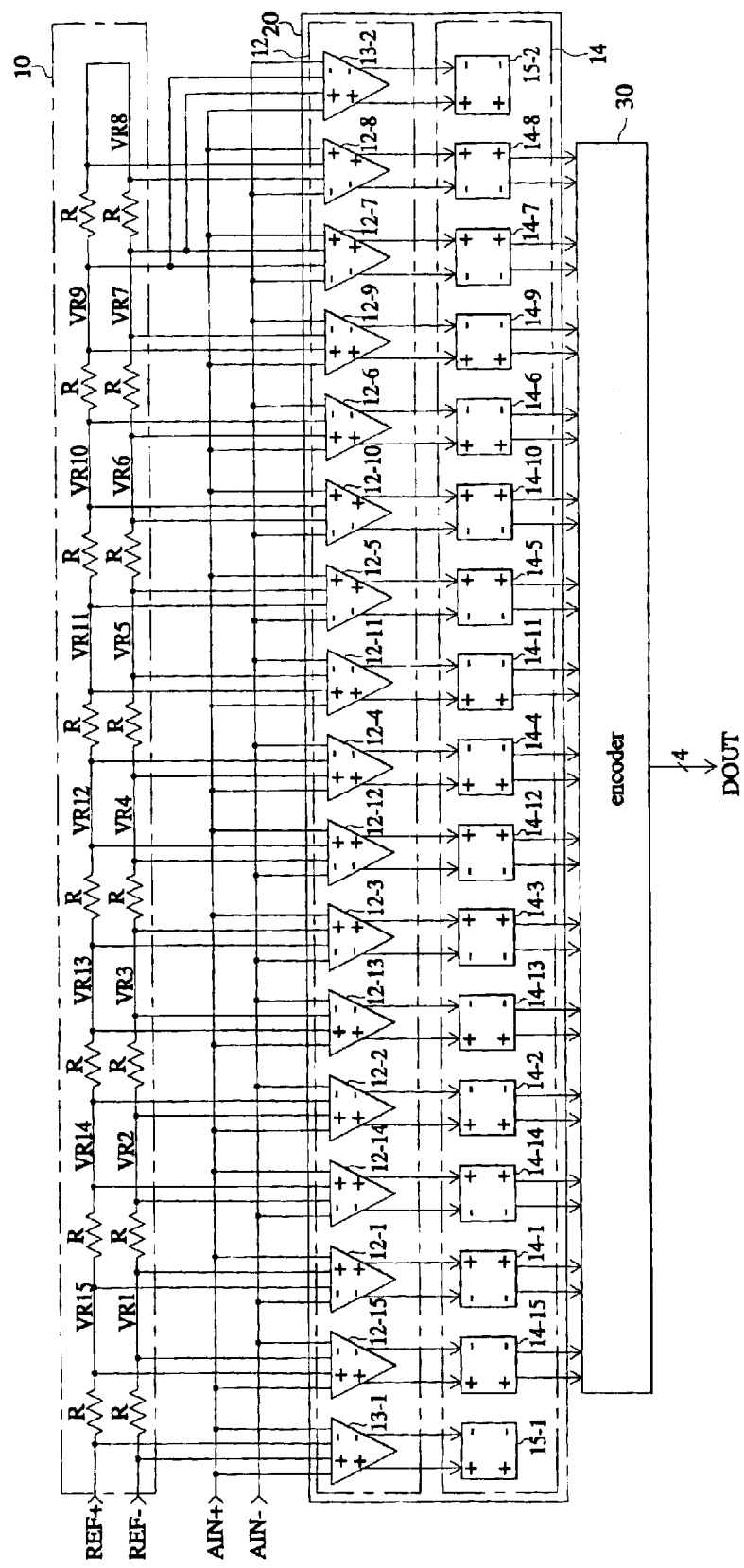
FIG. 3 is a circuit diagram illustrating another layout of a flash type A/D converting circuit according to the present invention.

FIG. 3 is a circuit diagram illustrating another layout of a flash type A/D converting circuit according to the present invention. The flash type A/D converting circuit of FIG. 3 is similar in configuration to that of FIG. 1 except that the negative and positive input and output terminals of the dummy pre-amplifiers 13-1 and 13-2, the pre-amplifiers 12-15, 12-2, 12-13, 12-4, 12-11, 12-6, and 12-9, the dummy latches 14-1 and 14-2, and the latches 14-15, 14-2, 14-13, 14-4, 14-11, 14-6, and 14-9 are different in position and that the reference voltages VR9 and VR7 are configured to be applied to the dummy pre-amplifier 13-2.

In FIG. 3, a circuit of the dummy pre-amplifiers 13-1 and 13-2 and the preamplifiers 12-15, 12-2, 12-13, 12-4, 12-11, 12-6, and 12-9 and a circuit of the preamplifiers 12-1, 12-14, 12-3, 12-12, 12-5, 12-10, 12-7, and 12-8 are symmetrically configured. Also, a circuit of the dummy latches 15-1 and 15-2 and the latches 14-15, 14-2, 14-13, 14-4, 14-11, 14-6, and 14-9 and a circuit of the latches 14-1, 14-14, 14-3, 14-12, 14-5, 14-10, 14-7, and 14-8 are symmetrically configured.

Operation of the flash type A/D converting circuit of FIG. 3 is the same as that of FIG. 1 and can be easily understood with reference to the description of FIG. 1.

Table 3 shows states of digital signals outputted from the negative and positive output terminals of the comparators in the comparator array according to a level of an analog input signal AIN in the flash type A/D converting circuit of FIG. 3.

TABLE 3

| AIN | DC1 − + | C15 − + | C1 − + | C14 − + | C2 − + | C13 − + | C3 − + | C12 − + | C4 − + | C11 − + | C5 − + | C10 − + | C6 − + | C9 − + | C7 − + | C8 − + | DC2 − + |
|---|---|---|---|---|---|---|---|---|---|---|---|---|---|---|---|---|---|
| 16 | 1 0 | 1 0 | 0 1 | 0 1 | 1 0 | 1 0 | 0 1 | 0 1 | 1 0 | 1 0 | 0 1 | 0 1 | 1 0 | 1 0 | 0 1 | 0 1 | 1 0 |
| 15 | 1 0 | 0 1 | 0 1 | 0 1 | 1 0 | 1 0 | 0 1 | 0 1 | 1 0 | 1 0 | 0 1 | 0 1 | 1 0 | 1 0 | 0 1 | 0 1 | 1 0 |
| 14 | 1 0 | 0 1 | 0 1 | 1 0 | 1 0 | 1 0 | 0 1 | 0 1 | 1 0 | 1 0 | 0 1 | 0 1 | 1 0 | 1 0 | 0 1 | 0 1 | 1 0 |
| 13 | 1 0 | 0 1 | 0 1 | 1 0 | 1 0 | 0 1 | 0 1 | 0 1 | 1 0 | 1 0 | 0 1 | 0 1 | 1 0 | 1 0 | 0 1 | 0 1 | 1 0 |
| 12 | 1 0 | 0 1 | 0 1 | 1 0 | 1 0 | 0 1 | 0 1 | 1 0 | 1 0 | 1 0 | 0 1 | 0 1 | 1 0 | 1 0 | 0 1 | 0 1 | 1 0 |
| 11 | 1 0 | 0 1 | 0 1 | 1 0 | 1 0 | 0 1 | 0 1 | 1 0 | 1 0 | 0 1 | 0 1 | 0 1 | 1 0 | 1 0 | 0 1 | 0 1 | 1 0 |

TABLE 3-continued

| AIN | DC1 −+ | C15 −+ | C1 −+ | C14 −+ | C2 −+ | C13 −+ | C3 −+ | C12 −+ | C4 −+ | C11 −+ | C5 −+ | C10 −+ | C6 −+ | C9 −+ | C7 −+ | C8 −+ | DC2 −+ |
|---|---|---|---|---|---|---|---|---|---|---|---|---|---|---|---|---|---|
| 10 | 1 0 | 0 1 | 0 1 | 1 0 | 1 0 | 0 1 | 0 1 | 1 0 | 1 0 | 0 1 | 0 1 | 1 0 | 1 0 | 1 0 | 0 1 | 0 1 | 1 0 |
| 9  | 1 0 | 0 1 | 0 1 | 1 0 | 1 0 | 0 1 | 0 1 | 1 0 | 1 0 | 0 1 | 0 1 | 1 0 | 1 0 | 0 1 | 0 1 | 0 1 | 1 0 |
| 8  | 1 0 | 0 1 | 0 1 | 1 0 | 1 0 | 0 1 | 0 1 | 1 0 | 1 0 | 0 1 | 0 1 | 1 0 | 1 0 | 0 1 | 0 1 | 1 0 | 1 0 |
| 7  | 1 0 | 0 1 | 0 1 | 1 0 | 1 0 | 0 1 | 0 1 | 1 0 | 1 0 | 0 1 | 0 1 | 1 0 | 1 0 | 0 1 | 1 0 | 1 0 | 0 1 |
| 6  | 1 0 | 0 1 | 0 1 | 1 0 | 1 0 | 0 1 | 0 1 | 1 0 | 1 0 | 0 1 | 0 1 | 1 0 | 0 1 | 0 1 | 1 0 | 1 0 | 0 1 |
| 5  | 1 0 | 0 1 | 0 1 | 1 0 | 1 0 | 0 1 | 0 1 | 1 0 | 1 0 | 0 1 | 1 0 | 1 0 | 0 1 | 0 1 | 1 0 | 1 0 | 0 1 |
| 4  | 1 0 | 0 1 | 0 1 | 1 0 | 1 0 | 0 1 | 0 1 | 1 0 | 0 1 | 0 1 | 1 0 | 1 0 | 0 1 | 0 1 | 1 0 | 1 0 | 0 1 |
| 3  | 1 0 | 0 1 | 0 1 | 1 0 | 1 0 | 0 1 | 1 0 | 1 0 | 0 1 | 0 1 | 1 0 | 1 0 | 0 1 | 0 1 | 1 0 | 1 0 | 0 1 |
| 2  | 1 0 | 0 1 | 0 1 | 1 0 | 0 1 | 0 1 | 1 0 | 1 0 | 0 1 | 0 1 | 1 0 | 1 0 | 0 1 | 0 1 | 1 0 | 1 0 | 0 1 |
| 1  | 1 0 | 0 1 | 1 0 | 1 0 | 0 1 | 0 1 | 1 0 | 1 0 | 0 1 | 0 1 | 1 0 | 1 0 | 0 1 | 0 1 | 1 0 | 1 0 | 0 1 |

Symbols of FIG. 3 are indicated by the same convention as those of FIG. 1.

A digital signal outputted from the comparators C1 to C15 of table 3 is the same as that outputted from the comparators C1 to C15 of table 1.

But, since positions of the negative and positive input and output terminals of the dummy comparators DC1 and DC2 and the comparators C15, C2, C13, C4, C11, C6, and C9 are changed, positions of the digital signals outputted are also changed.

As can be seen in table 3, when the digital signal outputted from the negative and positive output terminals of each of the comparators C1 to C15 transits from 0, 1 to 1, 0 or from 1, 0 to 0, 1, the digital signal outputted from the positive or negative output terminals of the neighboring comparators remains at 0 or 1. That is, the digital signal outputted from the positive or negative output terminals of the neighboring comparators adjacent to each of the comparators C1 to C15 remains at transits to the same state.

For example, in comparator C1, when the analog input signal transits from a level of REF− to VR1 to a level of VR1 to VR2, the digital signal of the negative output terminal transits from 1 to 0, and the digital signal of the positive output terminal transits from 0 to 1. At this time, the digital signal of the negative output terminal of the neighboring comparator C15 remains at 1, and the digital signal of the negative output terminal of the neighboring comparator C14 transits from 1 to 1. That is, the digital signals of the negative output terminals of the neighboring comparators C15 and C14 remains at the same state. Hence, an accurate digital signal can be generated because a phenomenon is prevented that the comparator C1 affects operation of the neighboring comparators C15 and C14 to thereby increase an offset voltage.

Similarly, accurate digital signals can be generated because a phenomenon is prevented that the comparators C2 to C15 affect operation of the neighboring comparators to thereby increase an offset voltage.

Figure 4:
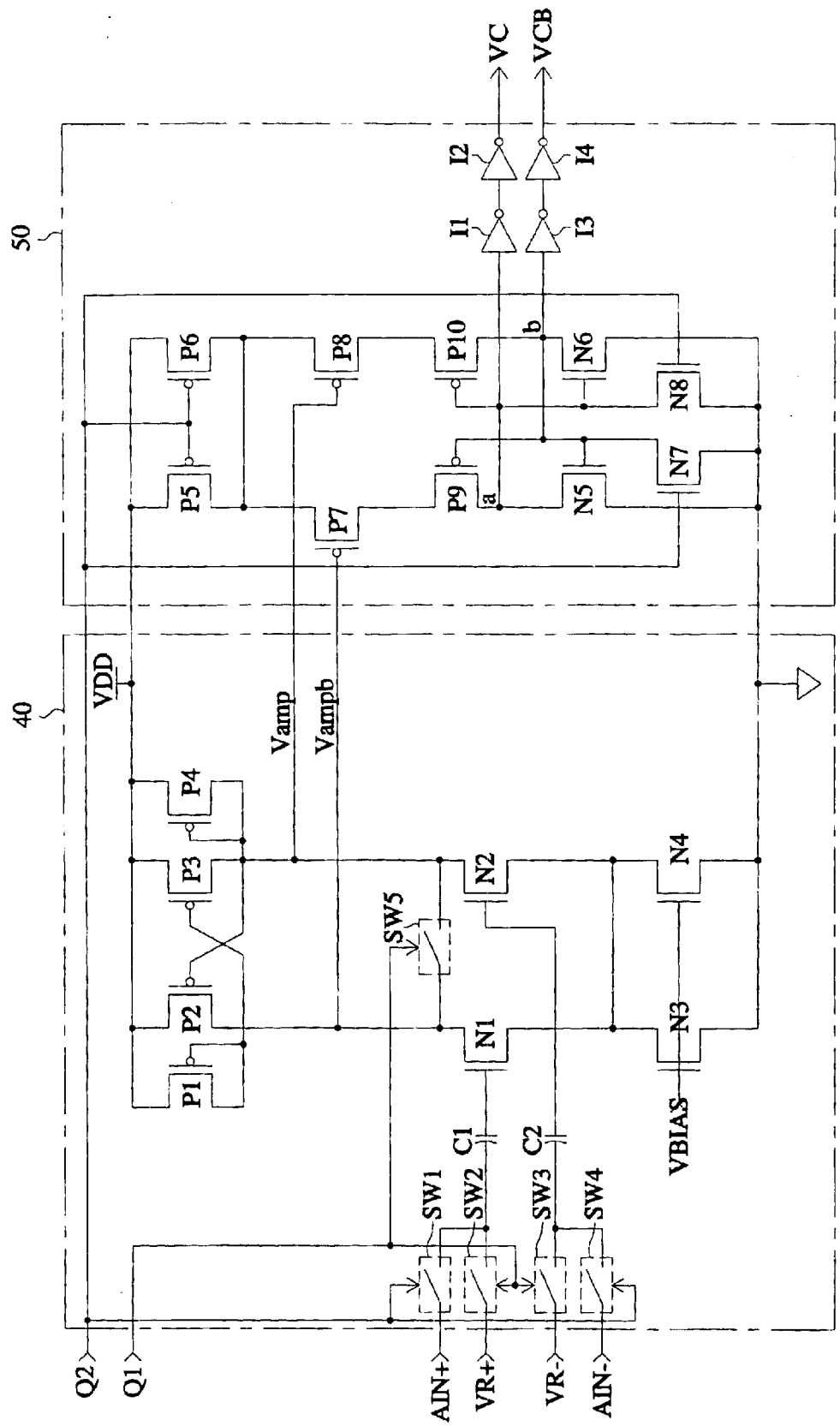
FIG. 4 is a circuit diagram illustrating a pre-amplifier and a latch in a comparator array of FIGS. 2 and 3.

FIG. 4 is a circuit diagram illustrating a pre-amplifier and a latch in the comparator array of FIGS. 2 and 3. The pre-amplifier 40 includes switches SW1 to SW5, capacitors C1 and C2, PMOS transistors P1 to P4, and NMOS transistors N1 to N4. The latch 50 includes PMOS transistors P5 to P10, NMOS transistors N5 to N8, and inverters I1 to I4.

In FIG. 4, the switches SW2, SW3, and SW5 are turned on or off in response to a control signal Q1, and the switches SW1 and SW4 are turned on or off in response to a control signal Q2. The control signals Q1 and Q2 have different phases, and the control signal Q2 transits to a "low" level before the control signal Q1 transits to a "high" level. The analog input signal AIN+ and the reference voltage VR+ are applied to a positive input terminal, and the analog input signal AIN− and the reference voltage VR− are applied to a negative input terminal.

Operation of the pre-amplifier and the latch of FIG. 4 are described below.

A bias voltage VBIAS is applied so that the NMOS transistors N3 and N4 are turned on, the switches SW2 and SW3 and SW5 are turned on in response to the control signal Q1 at a "high" level, the switches SW1 and SW4 are turned off in response to the control signal Q2 at a "low" level, the PMOS transistors P5 and P6 are turned on, and NMOS transistors N7 and N8 are turned off.

As a result, the capacitor C1 is charged with charges corresponding to the reference voltage VR+, and the capacitor C2 is charged with charges corresponding to the reference voltage VR−. At this time, since the switch SW5 remains on, levels of amplifying signals Vamp and Vampb become equal. The latch 50 generates signals latched on nodes a and b as the digital signals VC and VCB.

Thereafter, the switches SW2, SW3 and SW5 are turned off in response to the control signal Q1 at a "low" level, the switches SW1 and SW4 are turned on in response to the control signal Q2 at a "high" level, the PMOS transistors P5 and P6 are turned off, and NMOS transistors N7 and N8 are turned on.

As a result, the capacitor C1 is charged with summation of charges corresponding to the reference voltage VR+ and charges corresponding the analog input signal AIN+, and the capacitor C2 are charged with summation of charges corresponding to the reference voltage VR− and charges corresponding the analog input signal AIN−. This results in a difference between voltages applied to gates of the NMOS transistors N1 and N2. If a voltage applied to a gate of the NMOS transistor N1 is higher than that applied to a gate of the NMOS transistor N2, the amplifying signals Vamp and Vampb respectively having a "high" level and a "low" level are generated, and in the case of contrary case the amplifying signals Vamp and Vampb respectively having a "low" level and a "high" level are generated. Since the NMOS transistors N7 and N8 remain on, the nodes a and b become a ground voltage level. The inverters I1 and I2 and the inverters I3 and I4 buffer signals on the nodes a and b to generate the digital signals VC and VCB of 0 and 0, respectively.

When the control signal Q2 transits from a "high" level to a "low" level, the PMOS transistors P5 and P6 are turned on, and the NMOS transistors N7 and N8 are turned off.

As a result, according to a level of the amplifying signals Vamp and Vampb, amounts of electric current flowing through the PMOS transistors P7 and P9 and the PMOS transistors P8 and P10 are changed, so that levels of the signals on the nodes a and b are changed. The inverters I1 and I2 and the inverters I3 and I4 buffer signals on the nodes a and b to generate the digital signals VC and VCB of 1 and 0 or 0 and 1.

An offset voltage occurring by the affects of operation of the neighboring comparator can be removed by arranging the comparator of FIG. 4 and the comparator (not shown) having a symmetric configuration to the comparator of FIG. 4 according to the layout of the comparator array of the present invention.

The comparator of FIG. 4 is exemplary and can be configured in other forms.

The layout method of the comparator array described above includes a configuration of the dummy pre-amplifier and the dummy latch, but the present invention can be applied to a case that the dummy pre-amplifier and the dummy latch are not included.

The layout method of the comparator array described above is described using the flash type A/D converting circuit, but the present invention can be applied to circuits other than the flash type A/D converting circuit.

As described hereinbefore, the layout method of the comparator array of the flash type A/D converting circuit according to the present invention prevents an offset voltage from being increased by arranging the comparators so that the neighboring comparators can transit to the same state when the comparators transit to the different states.

Further, the flash type A/D converting circuit designed by the layout method of the present invention can generate an accurate digital signal without increasing a layout area size.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A layout method of a comparator array of a flash type analog to digital converting circuit, the flash type analog to digital converting circuit including: (i) a reference voltage for generating ($2^n-1$) voltages and being arranged to be folded; (ii) a comparator array including ($2^n-1$) comparators for comparing voltage differences between the respective ($2^n$-b 1) voltages and an analog input signal to generate a digital thermometer code having ($2^n-1$) bits; and (iii) an encoder for encoding the digital thermometer code having ($2^n-1$) bits to generate an n-bit of digital signal, the layout method comprising:

arranging the comparators such that the comparators of $(2^n-1)^{th}$ comparator to $(2^n/2)^{th}$ comparator are arranged in order and the comparators of $(2^n/2-1)^{th}$ comparator to a first comparator are arranged in a reverse fashion between the comparators of the $(2^n-1)^{th}$ comparator to the $(2^n/2)^{th}$ comparator; and arranging the comparators such that the neighboring comparators adjacent to the respective $(2^n-1)$ comparators remains at the same state when the $(2^n-1)^{th}$ comparator to the $(2^n/2)^{th}$ comparator transit to different states respectively.

2. The layout method of claim 1, wherein each of the ($2^n-1$) comparators includes a positive input and output terminal and a negative input and output terminal, and the terminals of the comparators from the $(2^n-1)^{th}$ comparator to the $(2^n/2)^{th}$ comparator are arranged in order of the positive input and output terminal, the negative input and output terminal, the negative input and output terminal, the positive input and output terminal, the negative input and output terminal, the positive input and output terminal, the positive input and output terminal, and the negative input and output terminal.

3. The layout method of claim 1, wherein each of the ($2^n-1$) comparators includes a positive input and output terminal and a negative input and output terminal, and the terminals of the comparators from the $(2^n-1)^{th}$ comparator to the $(2^n/2)^{th}$ comparator are arranged in order of the negative input and output terminal, the positive input and output terminal, the positive input and output terminal, the negative input and output terminal, the positive input and output terminal, the negative input and output terminal, the negative input and output terminal, and the positive input and output terminal.

4. The layout method of claim 1, wherein the comparator array includes first and second dummy comparators, the first dummy comparator arranged adjacent to the $(2^n-1)^{th}$ comparator, the second dummy comparator arranged adjacent to $(2^n/2)^{th}$ comparator, wherein the comparators from the first dummy comparator to the second dummy comparators includes positive and negative input and output terminals, respectively, and the terminals of the comparators from the first dummy comparator to the second dummy comparators are arranged in order of the positive input and output terminal, the negative input and output terminal, the positive input and output terminal, the negative input and output terminal, the negative input and output terminal, the positive input and output terminal, the negative input and output terminal, and the positive input and output terminal.

5. The layout method of claim 4, wherein the second dummy comparator is configured such that a reference voltage and an analog input signal applied to the positive input terminal of the $(2^n/2-1)^{th}$ comparator are applied to the positive input terminal of the second dummy comparator, and a reference voltage and an analog input signal applied to the positive input terminal of the $(2^n/2-1)^{th}$ comparator are applied to the positive input terminal of the second dummy comparator.

6. The layout method of claim 1, wherein the the comparator array includes first and second dummy comparators, the first dummy comparator arranged adjacent to the $(2^n-1)^{th}$ comparator, the second dummy comparator arranged adjacent to $(2^n/2)^{th}$ comparator, wherein the comparators from the first dummy comparator to the second dummy comparators include positive and negative input and output terminals, respectively, and the terminals of the comparators from the first dummy comparator to the second dummy comparators are arranged in order of the negative input and output terminal, the positive input and output terminal, the negative input and output terminal, the positive input and output terminal, the positive input and output terminal, the negative input and output terminal, the positive input and output terminal, and the negative input and output terminal.

7. The layout method of claim 6, wherein the second dummy comparator is configured such that a reference voltage and an analog input signal applied to the positive input terminal of the $(2^n/2-1)^{th}$ comparator are applied to the positive input terminal of the second dummy comparator, and a reference voltage and an analog input signal applied to the negative input terminal of the $(2^n/2-1)^{th}$ comparator are applied to the negative input terminal of the second dummy comparator.

8. A layout method of a comparator array, comprising:

among $(2^n-1)$ comparators for comparing voltage differences between each of $(2^n-1)$ voltages and an analog input signal to generate a digital signal having $(2^n-1)$ thermometer codes, arranging the comparators such that the comparators of $(2^n-1)^{th}$ comparator to $(2^n/2)^{th}$ comparator are arranged in order and the comparators of $(2^n/2-1)_{th}$ comparator to a first comparator are arranged in reverse fashion between the comparators of the $(2^n-1)^{th}$ comparator to the $(2^n/2)^{th}$ comparator; and arranging the comparators such that the neighboring comparators adjacent to the respective $(2^n-1)$ comparators remain at the same state when the $(2^n-1)^{th}$ comparator to the $(2^n/2)^{th}$ comparator transit to different states respectively.

9. The layout method of claim 8, wherein each of the $(2^n-1)$ comparators includes a positive input and output terminal and a negative input and output terminal, and the terminal of the comparators from the $(2^n-1)^{th}$ comparator to the $(2^n/2)^{th}$ comparator are arranged in order of the positive input and output terminal, the negative input and output terminal, the negative input and output terminal, the positive input and output terminal, the negative input and output terminal, the positive input and output terminal, the positive input and output terminal, the positive input and output terminal, and the negative input and output terminal.

10. The layout method of claim 8, wherein each of the $(2^n-1)$ comparators includes a positive input and output terminal and a negative input and output terminal, and the terminals of the comparators from the $(2^n-1)^{th}$ comparator to the $(2^n/2)^{th}$ comparator are arranged in order of the negative input and output terminal, the positive input and output terminal, the positive input and output terminal, the negative input and output terminal, the positive input and output terminal, the negative input and output terminal, the negative input and output terminal, and the positive input and output terminal.

* * * * *

UNITED STATES PATENT AND TRADEMARK OFFICE
CERTIFICATE OF CORRECTION

PATENT NO. : 6,891,494 B2
DATED : May 10, 2005
INVENTOR(S) : Hee-Cheol Choi

It is certified that error appears in the above-identified patent and that said Letters Patent is hereby corrected as shown below:

Column 11,
Line 47, delete "$(2^n\text{-b }1)$" and insert -- $(2^n\text{-}1)$ --.

Column 12,
Lines 42 and 43, delete "positive" and insert -- negative --.

Signed and Sealed this

Thirtieth Day of August, 2005

JON W. DUDAS
*Director of the United States Patent and Trademark Office*